United States Patent
Menon et al.

(10) Patent No.: US 12,119,080 B1
(45) Date of Patent: Oct. 15, 2024

(54) EXTENDED-BURST WRITE TRAINING

(71) Applicant: Cadence Design Systems, Inc., San Jose, CA (US)

(72) Inventors: Sreeja Menon, Bangalore (IN); Nikhil Raghavendra Rao, Bangalore (IN); Srinivas Shanmukha Gundlapalli, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 160 days.

(21) Appl. No.: 17/717,419

(22) Filed: Apr. 11, 2022

Related U.S. Application Data

(60) Provisional application No. 63/176,796, filed on Apr. 19, 2021.

(51) Int. Cl.
*G11C 7/10* (2006.01)
*G11C 8/18* (2006.01)

(52) U.S. Cl.
CPC .......... *G11C 7/1096* (2013.01); *G11C 7/1063* (2013.01); *G11C 7/1066* (2013.01); *G11C 7/1093* (2013.01); *G11C 8/18* (2013.01)

(58) Field of Classification Search
CPC ................ G11C 7/1096; G11C 7/10
USPC .......................................... 365/191
See application file for complete search history.

(56) References Cited

U.S. PATENT DOCUMENTS

| | | | |
|---|---|---|---|
| 6,643,787 B1 | 11/2003 | Zerbe et al. | |
| 7,171,321 B2 | 1/2007 | Best | |
| 7,668,276 B2 | 2/2010 | Hampel et al. | |
| 7,886,174 B2 | 2/2011 | Spry et al. | |
| 7,990,781 B1* | 8/2011 | Venkataraman | G06F 13/1689 |
| | | | 365/233.5 |
| 8,526,249 B1* | 9/2013 | Swanson | G11C 7/222 |
| | | | 365/194 |
| 8,737,162 B2 | 5/2014 | Ware et al. | |
| 9,183,125 B2 | 11/2015 | Brandl et al. | |
| 9,263,103 B2 | 2/2016 | Giovannini et al. | |
| 9,886,987 B1 | 2/2018 | Brahmadathan et al. | |
| 11,763,865 B1* | 9/2023 | Fuller | G11C 7/222 |
| | | | 365/233.1 |
| 2018/0174633 A1 | 6/2018 | Lee et al. | |
| 2021/0304809 A1* | 9/2021 | Waldrop | G11C 29/028 |

* cited by examiner

*Primary Examiner* — Muna A Techane
(74) *Attorney, Agent, or Firm* — Mark H. Whittenberger; Holland & Knight LLP

(57) ABSTRACT

A control component transmits a timing strobe and associated write data burst to a memory component, extending the write data burst to include a quantity of successive bits in excess of active edges in the timing strobe to ensure that the write data burst is sampled under worst-case timing skew conditions.

20 Claims, 4 Drawing Sheets

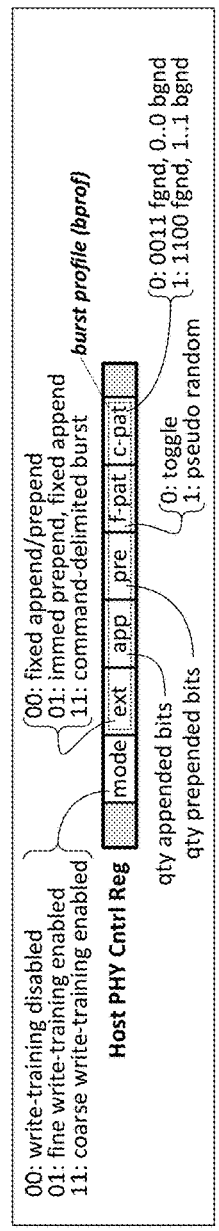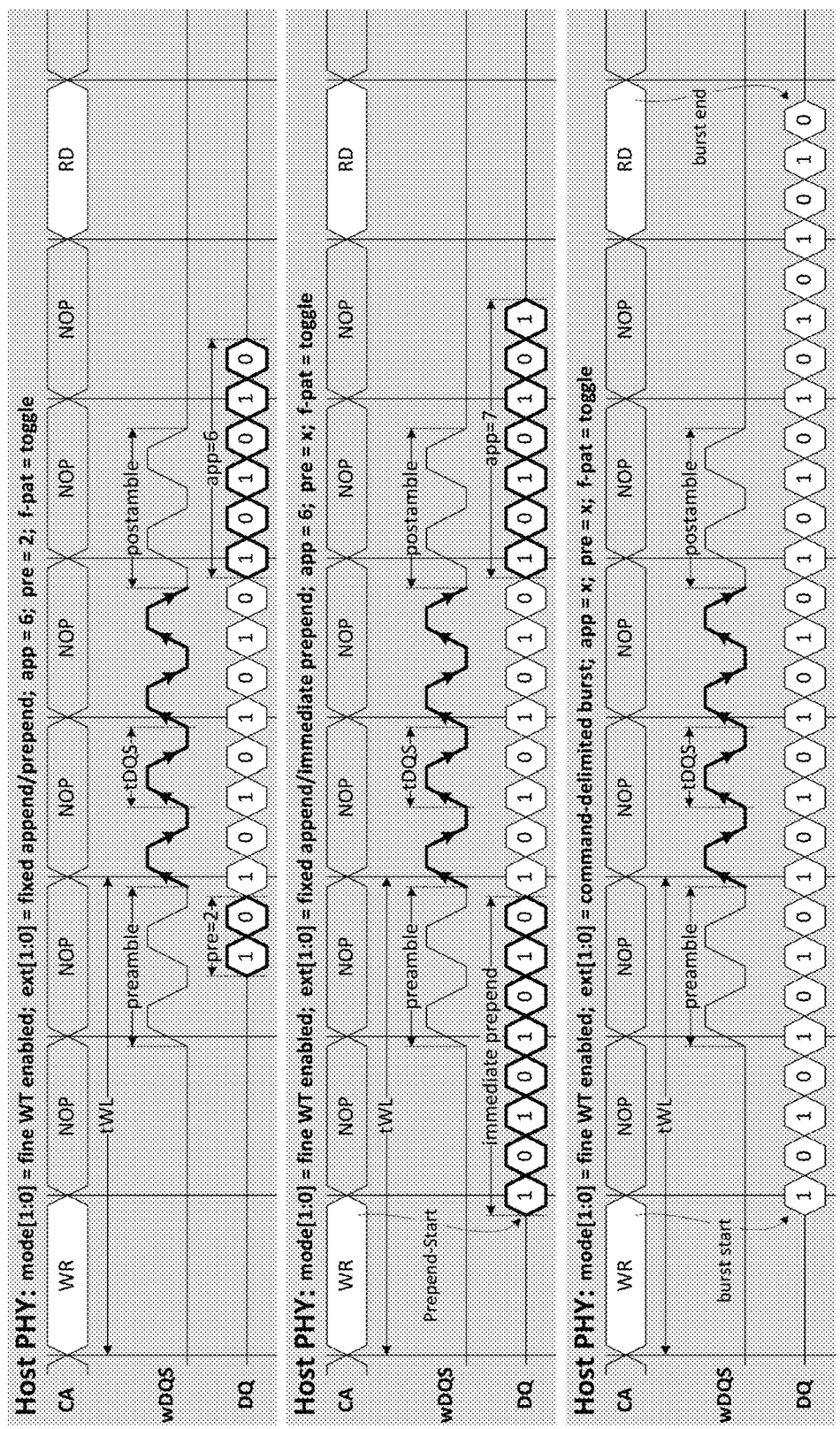

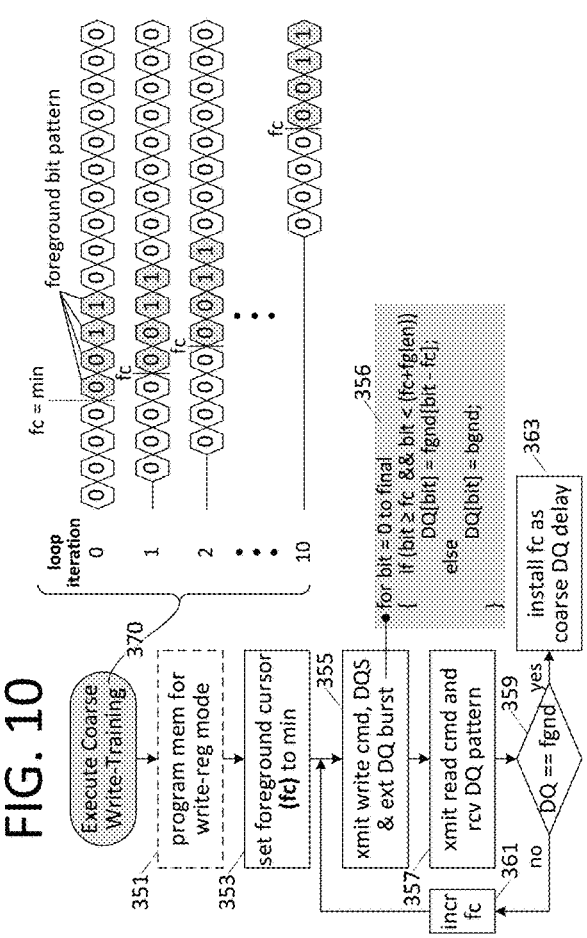
FIG. 10
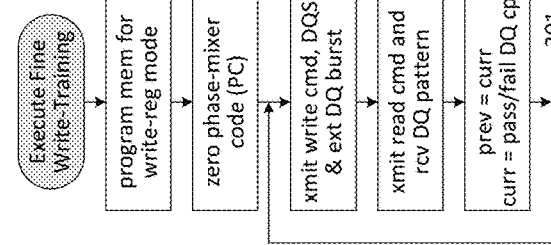
FIG. 9
FIG. 8
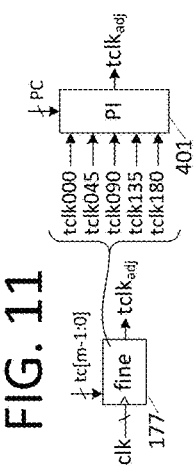
FIG. 11
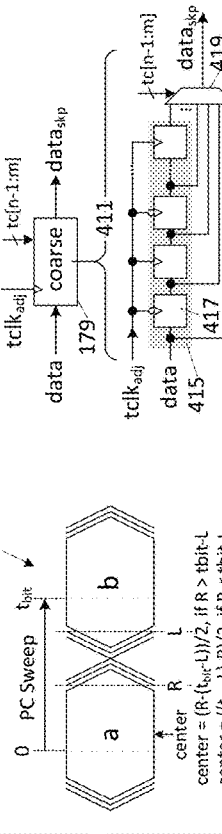
FIG. 12
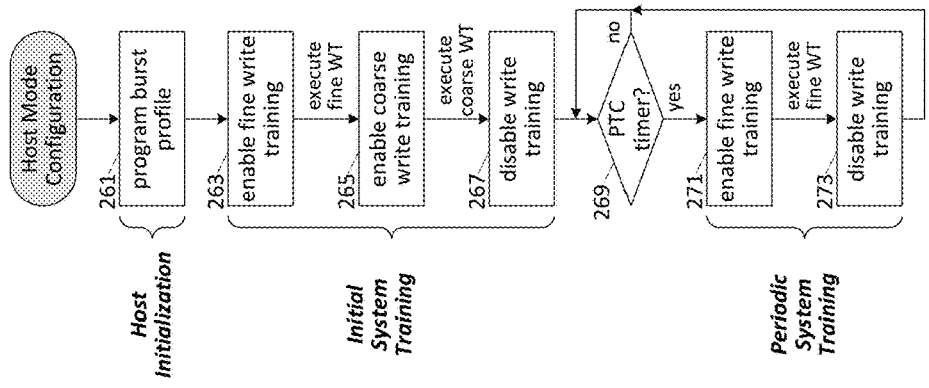

EXTENDED-BURST WRITE TRAINING

CROSS REFERENCE TO RELATED APPLICATIONS

This application hereby incorporates by reference and claims the filing-date benefit of U.S. Provisional Application No. 63/176,796 filed Apr. 19, 2021.

DRAWINGS

The various embodiments disclosed herein are illustrated by way of example, and not by way of limitation, in the figures of the accompanying drawings and in which like reference numerals refer to similar elements and in which:

FIG. 4 illustrates an exemplary control register implementation within the host PHY showing fields therein that may be programmed to enable coarse and fine write training modes and to tailor various characteristics of the extended data burst to be transmitted during those training modes;

FIGS. 5, 6 and 7 illustrate examples of burst-extension profiles enabled by respective programming options within the FIG. 4 control register;

FIG. 8 illustrates an exemplary sequence of operations executed within the host PHY of FIG. 1 in connection with coarse and fine write training;

FIG. 9 illustrates an exemplary fine write training sequence executed within the host PHY;

FIG. 10 illustrates an exemplary coarse training operation in which the relative phase offset between write data strobe transmission and write data transmission is adjusted by one or more whole bit intervals to compensate for skew not discernible with some fine-training data patterns;

FIG. 11 illustrates an embodiment of the fine-adjust circuit shown in FIG. 1; and FIG. 12 illustrates an embodiment of the coarse-adjust circuit shown in FIG. 1.

DETAILED DESCRIPTION

In various embodiments presented herein, a control component transmits a timing strobe and associated write data burst to a memory component, extending the write data burst to include a quantity of successive bits in excess of active edges in the timing strobe to ensure that the write data burst is sampled under worst-case timing skew conditions. In a number of embodiments, minimum and maximum timing skew between a gated instance of the timing strobe and the write data burst is specified by values supplied to or prerecorded within the memory control component or other element of a host system in which the memory control component is deployed and, during system startup, applied to establish the number of bits by which the write data burst is to be extended, prepending and/or appending that number of bits to a pre-programmed or fixed write data burst length. In other embodiments, extension of the write data burst is established temporally in relation to commands transmitted to the memory component, for example, commencing write data transmission in response to write command transmission (i.e., early relative to an otherwise applicable burst-start time) and/or terminating write data transmission in response to a subsequent command transmission (late relative an otherwise applicable burst-end time). In a number of implementations, write data burst extension is activated selectively ("selective burst extension"), for example, in response to one or more commands that render the control component into respective write training modes (e.g., at system startup and occasionally thereafter)—extending write data bursts during those training modes to ensure data sampling within the memory component under all permissible skew conditions.

Figure 1:
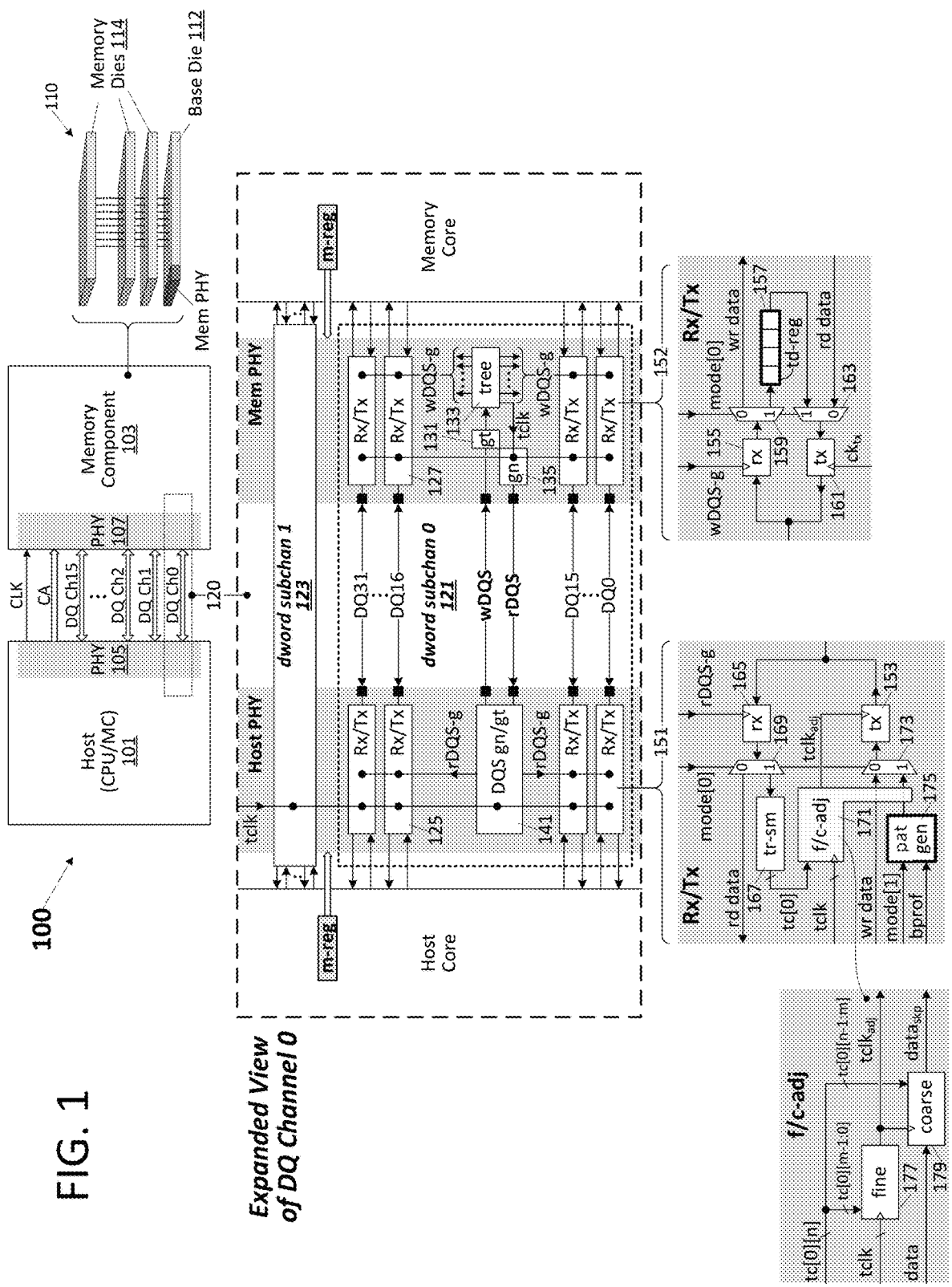
FIG. 1 illustrates an embodiment of a selective-burst-extension memory system.

FIG. 1 illustrates an embodiment of a selective-burst-extension memory system 100 having a "host" memory control component 101 (e.g., a standalone memory controller or a processing unit, application-specific integrated circuit (ASIC) or other IC having an integrated memory controller) and a memory component 103, each having respective physical signaling interfaces (PHYs) 105, 107 coupled to one another via data and control links. In the depicted example, the data links are organized in sixteen "data channels" (DQ Ch0, DQ Ch1, . . . . DQ Ch15) each implemented by a respective group of 64 bidirectional data (DQ) links and a corresponding set of data strobe links, the latter to convey data strobe signals ("DQS") applied within the signal-destination PHY to time data sampling operations-write data sampling within memory PHY 107 and read data sampling within the host PHY 105. Various commands, including memory-read and memory-write commands and address values associated therewith, are conveyed over a command/address path (CA), with command/address reception timed by a system clock signal (CLK) generated within host 101 and forwarded to the memory component 103. Though not specifically shown, separate instances of the system clock and CA path may be provided for each data channel (thus forming, in this example, 16 independent memory channels). Also, various signals other than command/address and system clock signals may be conveyed via control links between the host and memory components including, for example and without limitation, chip-select signals, on-die termination signals, clock-enable signals, power-mode signals, low-speed interface signals, etc.

In a number of embodiments, memory component 103 is implemented by a multi-die integrated circuit (e.g., as shown at 110) having a base die 112 containing memory PHY 107 and one or more memory dies 114 stacked on and interconnected to the base die via through-silicon vias (TSVs) and/or any other practicable stacked-die interconnects. The base die may be a dedicated logic die having no core storage array, or may itself be a memory die (e.g., implemented identically to the other memory dies and for which PHY circuitry is enabled by virtue of memory component strapping, programming etc.). The core storage array within each individual memory die (and optionally within the base die) may be implemented by any practicable integrated-circuit storage technology including, for example and without limitation dynamic random access memory (DRAM), static random access memory (SRAM) and any of various types of non-volatile storage (Flash memory, phase-change memory, magneto-resistive memory, etc.). More generally, memory component 103 may be implemented in and organized in various form-factors other than the stacked-die package shown, including various types of stacked-die and/or system-in-package organizations (including, for example, an integrated circuit (IC) package that integrates host component 101 with the one or more dies that constitute memory component 103), memory modules (e.g., dual-inline memory modules (DIMMs)), and so forth.

More detailed examples of a data channel and corresponding host-side/memory-side PHY implementations (and their interconnections to the host and memory cores, respectively) are presented in expanded view 120 (still FIG. 1), showing an implementation of data channel 0 (i.e., a 64 DQ data channel) in the form of two 32-link ("dword") subchannels (121, 123) each implemented by a respective set of 32 bi-directional links and a pair of unidirectional data strobe links-a write DQS link to convey a write-data strobe (wDQS) from the host PHY to the memory PHY, and a read DQS link to convey a read-data strobe (rDQS) from the memory PHY to the host PHY. Each of the strobe signals is transmitted in association with a read or write data burst and has a predetermined number of "active edges" (data-timing transitions) that trigger sampling of burst-constituent data symbols (i.e., generally assumed herein to be bits, though multi-bit symbols may instead be conveyed in all cases) together with predefined preamble and postamble waveforms. Strobe gating and distribution circuitry within the destination PHY (the memory PHY for write data/wDQS, and the host PHY for read data/rDQS) gates/strips away all strobe signal transitions other than the active edges, distributing those edges (i.e., toggling signal) to data sampling circuits within the PHY transceivers 125/127 to time data sampling operations. Within the memory PHY, for example, gating circuit 131 gates preamble/postamble transitions within the incoming write data strobe, forwarding active edges-a gated write data strobe—to a clock tree circuit 133 which, in turn, drives multiple same-phase instances of the gated wDQS ("wDQS-g") to the 32 dword transceivers 127, and more specifically to data sampling circuits therein. During read data transmission, a memory-side strobe signal generator 135 transmits a read data strobe to the host PHY (via link "rDQS") synchronously with respect to a transmit clock ("tclk"—a clock or strobe derived, for example, from a timing signal forward by the host PHY via the wDQS link and having, in various embodiments discussed below, a frequency and/or transition density twice that of the host-forwarded system clock). Strobe circuitry 141 within the host PHY gates the incoming read data strobe (driving gated instances thereof (rDQS-g) to host-side transceivers 125 to time sampling operations therein) and also generates and transmits the outbound write data strobe (wDQS).

In a number of embodiments, the host PHY includes calibration circuitry to compensate for timing skew over each data link (DQ) within each data subchannel by adjusting the per DQ read-data sampling instant and per DQ write-data transmission instant relative to corresponding data strobe signals-adjusting, during respective read and write training operations, the phase of rDQS-g relative to the incoming rDQS and the phase of a write-data transmit clock relative to wDQS. When operated in a pre-programmed training mode, the memory PHY responds to incoming write and read commands by diverting write data into a training-register (instead of forwarding the write data for storage within the memory core) and reading data back out of the training-register (instead of retrieving data from the memory core), respectively-operations that enable training/timing-adjust circuitry within the host PHY to compare data transmitted to and read-back from the memory PHY and thereby detect marginal timing-fail points and set transmit timing phases accordingly.

Still referring to FIG. 1, exemplary views 151 and 152 of transceiver circuits 125 and 127 (within the host PHY and memory PHY), respectively, illustrate conceptual write-training data flow and timing adjustment. Starting within the host-side PHY, transmitter 153 transmits a write data burst via the data link (DQ0 in this example) in association with a data-write command conveyed via the CA path, the write data burst being output bit by bit in response to successive edges (transitions) of a phase-adjusted transmit clock, $tclk_{adj}$. DQS circuitry 141 transmits a corresponding write data strobe via the wDQS link—also in association with the data-write command. The memory PHY responds to the incoming write command and write data strobe by generating a gated, buffered instance of the write data strobe—the aforementioned wDQS-g signal—supplying that gated strobe to a signal receiver/sampling circuit 155 to trigger (time) sampling of the incoming write data waveform and thus generation of write data samples that nominally correspond to the transmitted write data bits. The write data samples are routed, by virtue of a mode[0] control setting, into training-data register 157 ("training register") via multiplexer 159 (i.e., instead of to the memory core as will occur when mode[0] is deasserted). During an ensuing memory read (initiated by host transmission of a memory read command while still in training mode), training register contents are delivered to transmitter 161 via multiplexer 163 (i.e., instead of read data retrieved from the memory core as will occur when mode[0] is deasserted) and transmitted to the host PHY concurrently with a read data strobe signal (the latter transmitted via rDQS link by strobe generator 135 in response to the memory read command). The host PHY, in turn, samples the incoming training-data signal within receiver 165 (at times indicated by a gated read data strobe (rDQS-g) generated within strobe circuitry 141 in response to the incoming rDQS signal) to produce a recovered data stream, routing that data stream to a training state machine 167 via multiplexer 169 (i.e., in response to assertion of a training-mode signal mode[0]). The state machine 167 (or other sequencer or control circuitry) compares the transmitted and received training data bits for the current timing control value (tc[0]—used to control fine and coarse timing offsets within fine/coarse adjustment circuitry 171) and then, iteratively thereafter, for each of a sequence of timing control values, finding pass/fail timing phases and delaying the final transmit clock ($tclk_{adj}$) relative to a baseline transmit clock (tclk) and/or delaying write data delivery to the transmitter-operations discussed in greater detail below. In a number of embodiments, multiplexer 173 is provided to select, as a pattern data source (instead of a write data source within the host core), the output of a data pattern generator 175 during write-training, with the pattern generator producing write data burst patterns according to selection between coarse and fine training modes (e.g., a selection conveyed in control bit mode[1]) and/or a programmed burst profile. An exemplary implementation of the fine/coarse adjustment circuitry is shown at 171—having a fine-adjust circuit 177 to adjust the phase of the incoming transmit clock (and thereby produce $tclk_{adj}$) in accordance with the m least-significant bits of the n-bit timing control vector for the subject transceiver ("tc[0][n]"), and a coarse-adjust circuit 179 to delay propagation of a write data burst (i.e., yielding delayed data burst $wdata_{skp}$ in response to input burst wdata) by one or more tclk cycles or half-tclk cycles in accordance with the 'n-m' most-significant bits of the timing control vector.

Figure 2:
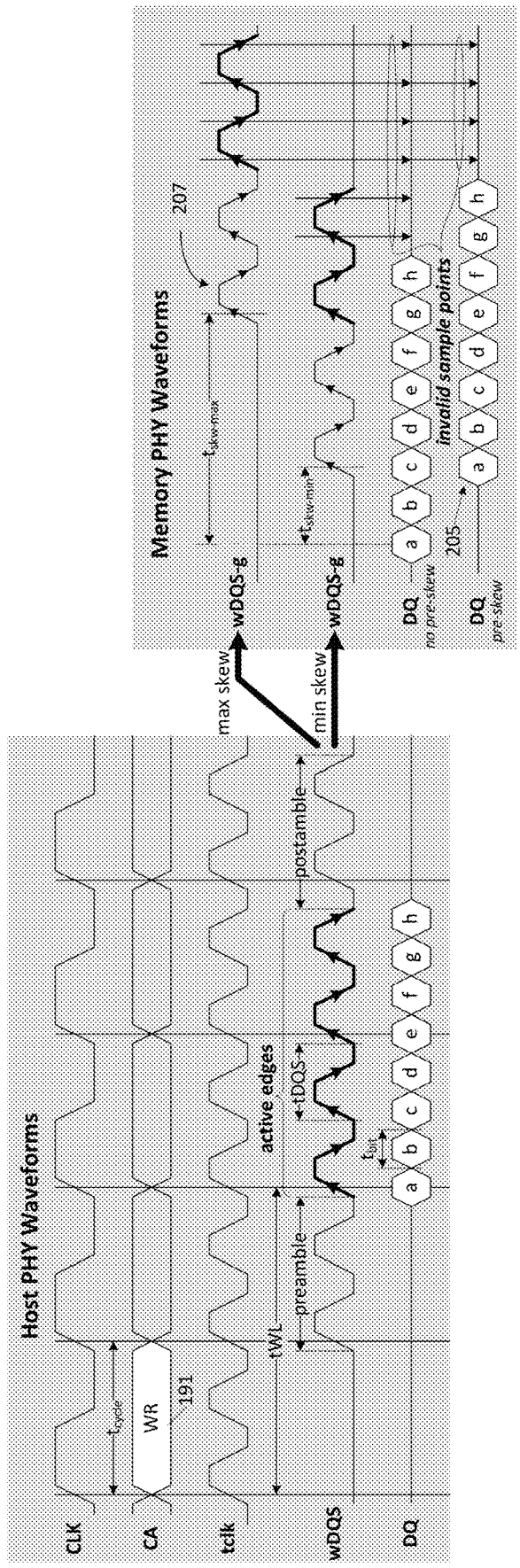
FIG. 2 illustrates exemplary pre-calibration data-write waveforms within the host and memory PHYs (physical signaling interfaces), showing minimum and maximum strobe-to-data timing skews within the memory PHY.

FIG. 2 illustrates exemplary pre-calibration data-write waveforms within the host and memory PHYs, showing minimum and maximum strobe-to-data timing skews within the memory PHY. Within the host PHY, command/address transmission is timed by the system clock signal (CLK), with a data-write command (and address value) being transmitted at 191. At a time according to a predetermined write latency ("tWL"), the host DQS generator begins transmitting the wDQS preamble, followed (at the tWL point) by transmission of the active strobe edges (bold with arrows showing the data-marking transitions) and then a postamble waveform as shown. Write data is transmitted (in this example) in an eight-bit data burst with each bit having a nominal eye width ($t_{bit}$) equal to half a transmit clock cycle (i.e., two bits transmitted in successive halves of a tclk cycle interval, where the tclk frequency is twice that of system clock, CLK) and corresponding to a respective one of the eight active wDQS edges. In alternative embodiments, the system clock/transmit clock frequency ratio may be larger or smaller than the 2× ratio shown, more or fewer than two bits may be transmitted per tclk cycle, the write latency value may be longer or shorter than two system clock cycles (four tclk cycles in this example), and characteristics of the preamble and/or postamble waveforms may vary from those shown (e.g., being longer or shorter, starting and/or ending from/at different parked voltage levels, etc.).

Still referring to the FIG. 2, wDQS propagation through the memory-PHY gating logic and distribution circuitry (e.g., clock tree, cross-die wiring, etc.) skews relative arrival times (at the data sampling circuits) of the gated write data strobe and incoming write data burst, generally with wDQS-g arriving sometime later than the write data burst-sometime between minimum and maximum timing skews, $t_{skw-min}$, $t_{skw-max}$, as shown in the memory PHY waveforms. Accordingly, one or more leading bits of the data burst may not be sampled (arriving prior to the first active strobe edge) and, conversely, one or more trailing edges of the gated wDQS may arrive after the data burst has transpired and thus trigger sampling of an undriven/invalid link state. Even where the host PHY pre-skews the data transmission (e.g., to account for the minimum memory-side timing skew as shown at 205), the relatively wide variability in memory-side skew (e.g., difference between $t_{skw-max}$ and $t_{skw-min}$ being two tclk cycles or $4*t_{bit}$ as in the example shown) will yield invalid sampling in some cases. Where only the trailing active strobe edges are used to sample data destined for training register storage (e.g., in some embodiments, including that shown in FIG. 1, per-DQ training register capacity may be limited to only two or four bits or otherwise fewer than the nominal write data burst length to minimize the collective training register footprint), any skew that yields one or more trailing strobe edges beyond the burst interval will produce invalid data samples and thus potentially prevent successful write training. In the case of a four-bit write training register that is loaded with samples from the final four active write strobe edges (first four active strobe edges unused), for instance, the maximum skew condition shown at 207 in FIG. 2 will yield four invalid write-training samples, complicating or altogether thwarting the write training operation.

Figure 3:
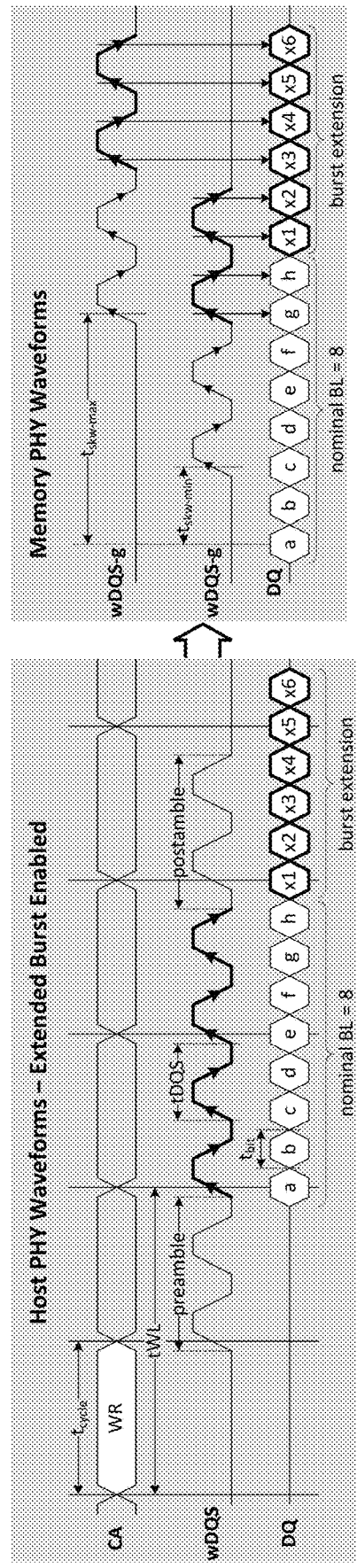
FIG. 3 illustrates exemplary extension of the write data burst beyond the nominal burst length and beyond the number of active strobe edges in the context of the FIG. 2 timing example.

When selective burst extension is enabled, the host PHY extends the write data burst beyond the nominal burst length and beyond the number of active strobe edges (i.e., beyond the burst length that will be applied during mission-mode operation of the memory system) upon entry into write-training mode to ensure that write training samples are captured under all skew conditions. FIG. 3 illustrates this extended-burst operation in the context of the FIG. 2 timing example. That is (after entering write-training mode), the host outputs a command, write data strobe and write data burst as in FIG. 2, but extends the write data burst beyond the active strobe edges according to a worst-case skew specification—in this case transmitting six extra write-training bits (beyond the nominal 8-bit burst length) and thus 14 bits overall as compared to only eight active strobe edges. By this operation, all edges of the gated write data strobe (and in particular the final edges thereof that are used to capture samples stored within the training register) occur within the bounds of the extended burst interval for any memory-side skew condition between the specified minimum and maximum.

FIG. 4 illustrates an exemplary control register implementation within the host PHY showing fields therein that may be programmed to enable coarse and fine write training modes and to tailor various characteristics of the extended data burst to be transmitted during those training modes, those characteristics collectively defining the write training "burst profile." In the embodiment shown, a two-bit "mode" field is programmed to either enable or disable write training mode (e.g., according to bit 0 of that field or "mode[0]" as shown in FIG. 1) and, if write-training is enabled (mode [0]=1), to configure the write data burst for either coarse or fine write training (e.g., according to mode[1] as also shown in FIG. 1). Within the burst profile, an extension field ("ext") specifies one of various types of burst extensions including, for example and without limitation, (i) a fixed append/prepend burst-extension in which predetermined quantities of bits are prepended and appended to the nominal data burst according to values programmed within "pre" and "app" fields, respectively, (ii) an immediate-prepend/fixed-append burst-extension in which the host PHY commences transmission of write training bits immediately upon transmission of a write command (or at a predetermined time with respect to transmission of the write command, with that time occurring prior to transmission of a nominal write data burst), followed by transmission of the nominal write data burst and then transmission of the predetermined number/ quantity of appended bits (again according to the "app" field), and (iii) a command-delimited extension in which write training bit transmission commences in response to transmission of a write command (e.g., similarly to immediate prepend) and continues indefinitely, terminating at transmission of a subsequent command (e.g., at or shortly before or after transmission of a read command). FIGS. 5, 6 and 7 respectively illustrate these three burst-extension profiles. In FIG. 5, for example, fine write training is enabled with the burst-extension mode set to fixed append/prepend, with the prepend and append bit counts set (by the "pre" and "app" fields within the FIG. 4 control register) to two and six, respectively, and the fine-training data pattern (set by a "f-pat" field within the host PHY control register) set to toggle (yielding a '101010101 . . . ' bit pattern). Accordingly, the host PHY transmits the write DQS a predetermined time after transmission of a write command, "WR" (e.g., starting the wDQS preamble at tWL minus preamble duration), and commences transmission of the extended write data burst two bit intervals prior to the first active strobe edge (i.e., in view of the prepend=2 register setting), followed by the nominal data burst (eight bits in this example, transmitted center-point aligned to the active wDQS edges) and then by the appended six data bits—16 data bits total versus 8 active DQS edges. FIG. 6 illustrates a waveform under the same register settings as in FIG. 5, except with the extension mode set to immediate prepend. Accordingly, training data transmission (in a toggle pattern) commences immediately after transmission of the write command and is followed by nominal burst transmission and then a fixed number of appended data bits (app=7 in this example). In the command-delimited bust-extension mode of FIG. 7, write training transmission commences in response to transmission of write command, WR, and continues indefinitely (with active strobe edges transmitted at nominal data burst transmission time) until transmission of a subsequent command—in this case a read command ("RD") which triggers burst termination ("burst end") as shown. Although toggle write training patterns are shown in the FIG. 5-7 examples, various alternative training patterns may be transmitted in response to other values programmed within the f-pat (pattern for fine-training) register field, including a pseudorandom pattern (i.e., generated, for example, by a linear feedback shift register or other pattern generator within the host PHY—and compared for purposes of timing adjustment with a like-generated pattern), user-defined pattern or any other practicable data pattern. Similarly, while a pair of foreground/background patterns are illustrated as coarse-training data pattern options ("c-pat" field of FIG. 4 control register), various other predetermined or user-defined patterns may be specified.

FIG. 8 illustrates an exemplary sequence of operations executed within the host PHY of FIG. 1 in connection with coarse and fine write training. Starting at 261, during host initialization, a burst profile is programmed into a control register within (or having outputs coupled to) the host PHY. Thereafter, during initial system training (which, though not specifically shown, may include various training sequences to calibrate synchronous command transmission/reception and read data transmission/reception), fine-write training is enabled by programming the mode field of the host control register (263). After fine write training is completed-a sequence of operations discussed in greater detail below—the mode field is reprogrammed at 265 to enable coarse write training and then reprogrammed again at 267 (after coarse write training is completed) to disable write training and thus complete the initial system training (or at least the write training portion thereof). In embodiments subject to ongoing timing phase drift (e.g., process-sensitive temperature- and/or voltage-induced drift), coarse and/or write training may be executed at predetermined (e.g., periodic) or event-driven intervals (e.g., in response to threshold bit error detection, in response to threshold temperature and/or voltage change, etc.). FIG. 8, for example, illustrates periodic execution of fine-write training—commenced in each iteration (i.e., upon detection/notification that a periodic timing calibration timer is expired at 269) by programming the host-PHY control register at 271 to enable the write training, execution of the fine write training and then reprogramming the control register at 273 to disable write training.

FIG. 9 illustrates an exemplary fine write training sequence executed within the host PHY, starting at 291 with transmission of a mode register programming command/operand to the memory component to program the memory PHY for operation in write-register mode (i.e., executing host-commanded memory write and read transactions with respect to the memory-PHY training register instead of the memory core). The host PHY zeroes or otherwise baselines a phase code used to control the adjusted tclk phase (e.g., applied to a phase mixer or phase interpolator within the fine-adjust circuit 177 of FIG. 1) at 293 and then, at 295 transmits a write command, write DQS and extended data burst to the memory component (e.g., according to the programmed burst profile as shown in FIGS. 5, 6, 7). At 297, the host issues a read command to trigger memory-side transmission of the registered training data, receiving and delivering inbound data to the host-PHY training state machine (e.g., circuit 167 of FIG. 1). At 299, the host-PHY training state machine compares the transmitted and read-back training data to generate a pass/fail (pattern match/no-match) result, assigning the result of a previously-generated pass/fail result (if any) to a "previous result" or "prev" variable, and assigning the newly generated pass/fail result to a "current result" ("curr") variable—assigning both prev and curr to the same value at the first-time generation of the pass/fail result (initial loop pass). The previous and current pass/fail results are compared at 301. If the results are the same (i.e., no pass/fail boundary has been encountered), the phase code is incremented at 303 (incrementally delaying the adjusted transmit clock) and the write, read-back and pattern compare operations at 295, 297, 299 are repeated at the new clock phase. Upon detecting inequality between previous and current pass/fail results (i.e., negative determination at 301—indicative of a pass/fail boundary transition), then if the current result indicates a successful compare (i.e., a "pass" and thus affirmative determination at 305), the most recent phase increment is deemed a transition from a failing phase range to a passing (successful data sampling) phase range and is thus recorded as a left (or leading) boundary of the open-data-eye phase range at 307. Conversely, if the current result indicates a fail (negative determination at 305), the most recent phase increment is deemed a transition from a passing phase range to a failing phase range and is thus recorded (optionally with decrement to restore the last passing phase code) as a right (or trailing) boundary of the open-data-eye phase range at 309. In either boundary recording instance (307 or 309), a count of the number of detected boundaries is incremented (i.e., to one or two according to whether the alternate boundary has already been detected and recorded) and then evaluated (at 311) to determine whether both the left and right data-valid boundaries have been found. If not (negative determination at 311), the phase code is incremented at 303 and the write/read-back/compare loop starting at 295 is repeated until both boundaries have been found. After both boundaries have been bound (affirmative determination at 311), the training state machine centers the phase code (and thus the phase of $tclk_{adj}$) midway between the leading/trailing boundaries. Examples of this operation are shown at 321 and 325, with the center/midway point being, for example, an average of the leading trailing boundaries where the phase code for the trailing boundary exceeds that for the leading boundary (i.e., such that both boundaries correspond to the same data eye as shown at 321), and a modulo average where the phase code for the leading boundary exceeds that for the trailing boundary (i.e., such that the two boundaries correspond to respective, successive data eyes as shown at 325).

FIG. 10 illustrates an exemplary coarse training operation in which the relative phase offset between wDQS and write data transmission is adjusted by one or more whole bit intervals ($t_{bit}$) to account for whole $t_{bit}$ or whole tclk-cycle skew not discernible with some fine-training data patterns (e.g., the toggle patterns shown in FIGS. 5-7). Starting at 351, the host PHY programs the memory component for write-register mode (an omissible operation where the memory component is left in write-register mode following a preceding fine write training sequence), and then, at 353, initializes a variable foreground cursor ("fc") to a minimum offset value—that is a minimum specified skew within the possible wDQS-to-DQ skew range. At 355, the host PHY transmits a write command, write data strobe and extended data burst to the memory component, with the data burst populated with background and foreground data patterns according to the exemplary pseudocode listing at 356. That is, each bit of the data burst that precedes the foreground cursor (i.e., a bit position within the data burst) is set according to the background bit state ("bgnd") and each bit of the data burst that falls between the foreground cursor and the foreground pattern length ("fglen") is set to the corresponding bit of the foreground pattern (i.e., "DQ[bit]=fgnd [bit−fc]"). At 357, the transmitted data burst is read back (i.e., read command transmitted, read data sampled) and then pattern-compared with the transmitted data. If the read-back data does not match the foreground pattern (negative determination at 359), the foreground cursor is incremented to the next $t_{bit}$ (or $t_{cycle}$) offset and the write/read-back/pattern-check operations at 355/357 are repeated-yielding a sequence of write training transmissions in which the foreground pattern is incrementally shifted as shown at 370 (shifting the foreground cursor by a $t_{bit}$ interval in the example shown, with foreground pattern length set to four to match the bit-depth of the memory-component training register). If the read-back data matches the foreground pattern, then the offset between current foreground cursor and minimum foreground cursor values is deemed to be the whole $t_{bit}$ (or whole tclk) delay and supplied to the coarse-adjust circuit (e.g., circuit 179 in FIG. 1) to effect a corresponding $t_{bit}$/tclk-cycle skip-aligning write data transmission such that each bit of a nominal data burst is sampled in response to a corresponding active-edge within the gated write data strobe. Note that the foreground pattern may be shifted forward (delayed) by more than a single $t_{bit}$ interval in each coarse-training loop iteration in alternative embodiments. For example, where fine training enables odd/even data eye distinction (e.g., where a toggle pattern is transmitted), the foreground bit pattern may be shifted by a tclk ($2*t_{bit}$) interval during each loop iteration as the intra-tclk phase (1→0 vs 0→1) may already be known.

FIGS. 11 and 12 illustrate exemplary implementations of the fine-adjust and coarse-adjust circuits 177 and 179, respectively, within fine/coarse-adjust circuit 171 of FIG. 1. In the FIG. 11 "fine-adjust" embodiment, a phase interpolator (PI) 401 responds to a phase code (i.e., constituted by the least significant m bits of the aforementioned timing control vector, tc[m−1:0]) by selecting a pair of tclk vectors (i.e., phase staggered instances of the transmit clock—in this example at 0°, 45°, 90°, 135° and 180°) and interpolating between the selected vectors in accordance with the phase code LSBs to produce the phase-adjusted tclk signal, $tclk_{adj}$. In the FIG. 12 embodiment, coarse-adjust circuit 179 is implemented by skip circuit 411 that selects, in accordance with the most significant n-m bits of the timing control value (tc[n−1:m]), the output of a synchronous delay line 415 to deliver a ($k*t_{bit}$)-delayed instance of the data waveform ($data_{skp}$) to a data transmitter (within a data transceiver of the host PHY). In the depicted example, delay line 415 is implemented by daisy-chained flop stages 417 each clocked by $tclk_{adj}$ and having successively inverted timing inputs so that data is advanced through the flop chain at each half-cycle of $tclk_{adj}$. The coarse delay selection value (i.e. tc[n−1:m], set according to the foreground cursor position identified in the coarse write training sequence) is applied to multiplexer 419 to select the output of a corresponding one of the flop stages 417 to constitute the cycle-skipped data burst ($data_{skp}$). In alternative embodiments, delay line 415 may lack timing inversion at alternate flop stages 417 so that the transmit data burst propagates two bits at time through the delay line at whole tclk intervals (i.e., with the bit-to-bit even/odd phase adjust implemented within the fine-adjust circuit through, for example, inversion of the finalized $tclk_{adj}$).

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, the various component form factors, burst lengths, signal waveforms (e.g., strobe preamble/postamble), frequency ratios, bit counts (e.g., register depth) and so forth may be different from those presented in embodiments herein. Additionally, links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A memory control integrated circuit (IC) comprising:
   a command interface to transmit a write command to a memory component; and
   a data interface to transmit to the memory component in association with the write command:
      a data strobe having a preamble and a first quantity of data-timing transitions that immediately follow the preamble; and
      a data burst constituted by a second quantity of data symbols transmitted in respective, successive symbol-transmission intervals, the second quantity exceeding the first quantity.

2. The memory control IC of claim 1 wherein the data interface to transmit the data strobe to the memory component in association with the write command comprises circuitry to commence transmission of the data strobe a predetermined time after transmitting the write command.

3. The memory control IC of claim 1 wherein the data interface to transmit the data strobe to the memory component comprises circuitry to transmit, in succession, the preamble, the first quantity of data-timing transitions, and a postamble.

4. The memory control IC of claim 1 further comprising a programmable register to store information indicative of a value by which the second quantity exceeds the first quantity.

5. The memory control IC of claim 1 wherein the data interface to transmit the data burst constituted by the second quantity of data symbols comprises data-transmit circuitry to transmit a first number of data symbols according to a nominal burst length followed continuously by a second number of data symbols, the first number of data symbols matching the first quantity of data-timing transitions.

6. The memory control IC of claim 5 wherein the data-transmit circuitry additionally transmits a third number of data symbols immediately prior to transmitting the first number of data symbols, the first, second and third numbers of data symbols collectively constituting the second quantity of data symbols.

7. The memory control IC of claim 1 wherein each of the data symbols is constituted by a respective bit.

8. The memory control IC of claim 1 wherein the data interface to transmit the data burst constituted by the second quantity of data symbols comprises data-transmit circuitry to (i) transmit the data burst constituted by the second quantity of data symbols during operation of the memory control component in a write-training mode, and (ii) transmit a data burst constituted by data symbols equal in number to the first quantity of data-timing transitions during operation of the memory control IC in an operating mode other than the write-training mode.

9. The memory control IC of claim 8 further comprising a programmable register to store a mode value in a first state to render the memory control IC into the write-training mode and to store a mode value in a state other than the first state to render the memory control IC into an operating mode other than the write-training mode.

10. The memory control IC of claim 1 wherein at least one of the command interface and the data interface comprises circuitry to transmit a register programming command/operand to the memory component, the register programming command/operand instructing the memory component to respond to the write command by storing at least a portion of the data burst within a training register instead of a core storage array of the memory component.

11. A method of operation within a memory control component, the method comprising:
   transmitting a write command to a memory component;
   transmitting a data strobe to the memory component in association with the write command, the data strobe having a preamble and a first quantity of data-timing transitions that immediately follow the preamble; and
   transmitting a data burst to the memory component in association with the write command, the data burst constituted by a second quantity of data symbols transmitted in respective, successive symbol-transmission intervals, the second quantity exceeding the first quantity.

12. The method of claim 11 wherein transmitting the data strobe to the memory component in association with the write command comprises commencing transmission of the data strobe a predetermined time after transmitting the write command.

13. The method of claim 11 wherein transmitting the data strobe to the memory component comprises transmitting, in succession, the preamble, the first quantity of data-timing transitions, and a postamble.

14. The method of claim 11 further comprising programming one or more fields of a programmable register with information indicative of a value by which the second quantity exceeds the first quantity.

15. The method of claim 11 wherein transmitting the data burst constituted by the second quantity of data symbols comprises transmitting a first number of data symbols according to a nominal burst length followed continuously by a second number of data symbols, the first number of data symbols matching the first quantity of data-timing transitions.

16. The method of claim 15 wherein transmitting the data burst constituted by the second quantity of data symbols further comprises transmitting a third number of data symbols immediately prior to transmitting the first number of data symbols.

17. The method of claim 11 wherein each of the data symbols is constituted by a respective bit.

18. The method of claim 11 wherein transmitting the data burst constituted by the second quantity of data symbols comprises transmitting the data burst constituted by the second quantity of data symbols during operation of the memory control component in a write-training mode, the method further comprising transmitting a data burst constituted by data symbols equal in number to the first quantity of data-timing transitions during operation of the memory control component in a mode other than the write-training mode.

19. The method of claim 18 further comprising storing a mode value within a control register of the memory control component to transition the memory control component to the write-training mode.

20. The method of claim 11 further comprising transmitting a register programming command/operand to the memory component to instruct the memory component to respond to the write command by storing at least a portion of the data burst within a training register instead of a core storage array of the memory component.

* * * * *